US008515695B2

(12) United States Patent
Devta-Prasanna et al.

(10) Patent No.: US 8,515,695 B2
(45) Date of Patent: Aug. 20, 2013

(54) METHOD AND AN APPARATUS FOR EVALUATING SMALL DELAY DEFECT COVERAGE OF A TEST PATTERN SET ON AN IC

(75) Inventors: Narendra B. Devta-Prasanna, Milpitas, CA (US); Sandeep Kumar Goel, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 374 days.

(21) Appl. No.: 12/421,481

(22) Filed: Apr. 9, 2009

(65) Prior Publication Data

US 2010/0262394 A1  Oct. 14, 2010

(51) Int. Cl.
*G01R 31/3181* (2006.01)

(52) U.S. Cl.
USPC .......... 702/58; 702/79; 702/89; 702/108; 702/181; 714/48; 714/738; 714/799; 716/112

(58) Field of Classification Search
USPC ............ 702/79, 58, 69, 89, 108; 714/48, 714/738, 741, 798, 799; 716/112
See application file for complete search history.

(56) References Cited

U.S. PATENT DOCUMENTS

| 6,728,914 | B2 | 4/2004 | McCauley et al. | |
|---|---|---|---|---|
| 7,671,579 | B1 * | 3/2010 | Chong et al. | 324/76.54 |
| 2007/0288822 | A1 * | 12/2007 | Lin et al. | 714/741 |
| 2008/0148209 | A1 | 6/2008 | Maeda et al. | |
| 2008/0295050 | A1 | 11/2008 | Maeda et al. | |
| 2010/0179784 | A1 * | 7/2010 | Crosby et al. | 702/117 |

OTHER PUBLICATIONS

Park, E., and Mercer, M. Statistical Delay Fault Coverage and Defect Level for Delay Faults. IEEE International Test Conference [online], 1988 [retrieved on Feb. 23, 2011]. Retrieved from the Internet: <URL: http://ieeexplore.ieee.org/stamp.stamp.jsp?tp=&arnumber=207761&isnumber=5318>.*

Turakhia, R., Daasch, W., Ward, M., and Slyke, J. Silicon Evaluation of Longest Path Avoidance Testing for Small Delay Defects. IEEE International Test Conference [online], Oct. 2007 [retrieved Mar. 7, 2012]. Retrieved from the Internet: <URL: http://ieeexplore.ieee.org/stamp/stamp.jsp?arnumber=04437564>.*

* cited by examiner

*Primary Examiner* — Alexander H Taningco
*Assistant Examiner* — Paul D Lee

(57) ABSTRACT

A method and an apparatus for evaluating SDDC of a test pattern set are disclosed. In one embodiment, the method includes: (1) selecting a transition fault of an IC detected by a test pattern set, the transition fault occurring at a fault site of the IC, (2) identifying path delays of a longest testable path and a longest tested path of the IC, wherein both the longest testable path and the longest tested path include the fault site, (3) determining a SDD detection probability for both the longest testable path and the longest tested path based on a probability that a SDD will be detected if present at the fault site and (4) calculating SDDC for the transition fault by dividing the SDD detection probability of the longest tested path by the SDD detection probability of the longest testable path.

20 Claims, 5 Drawing Sheets

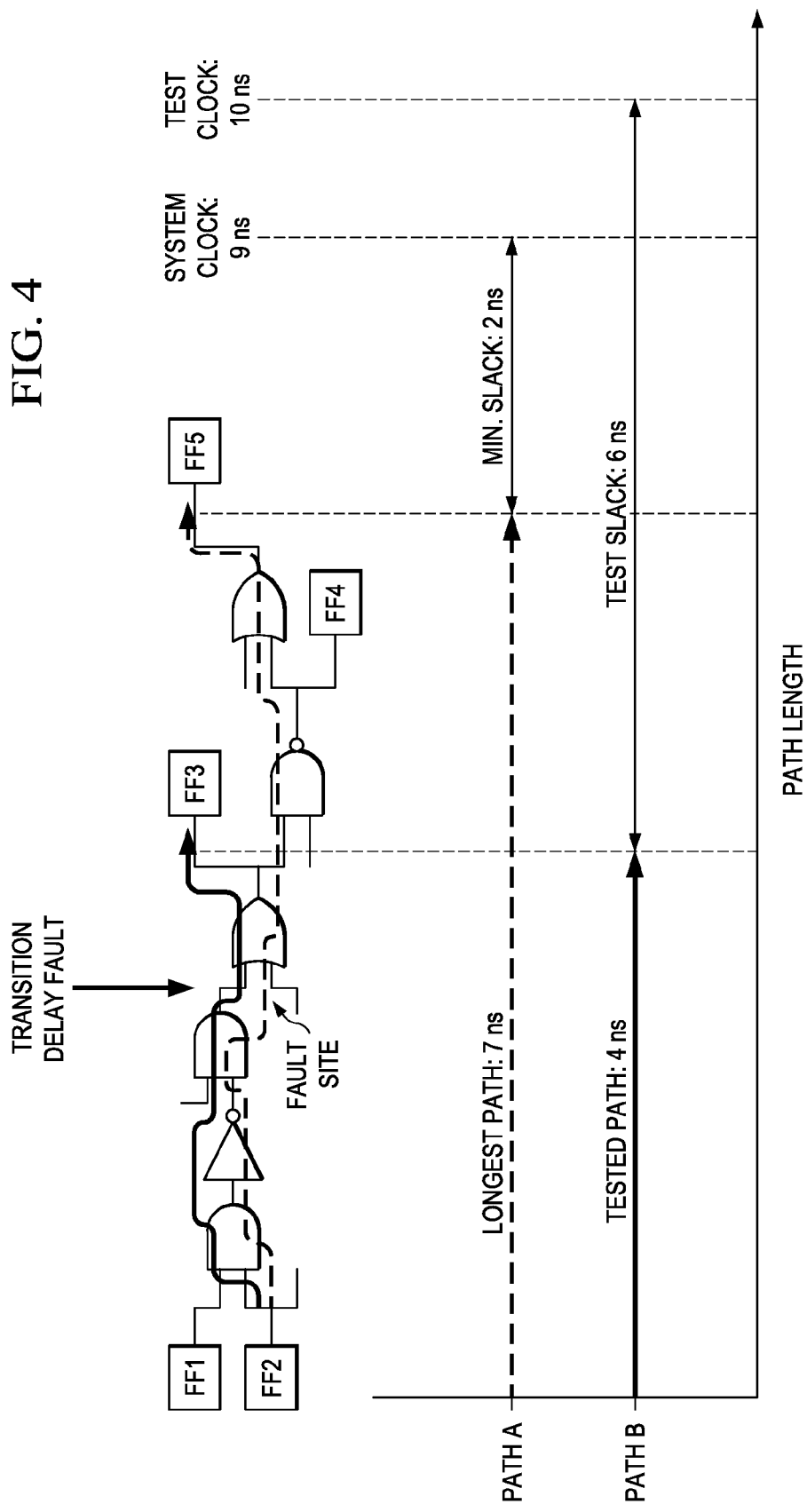

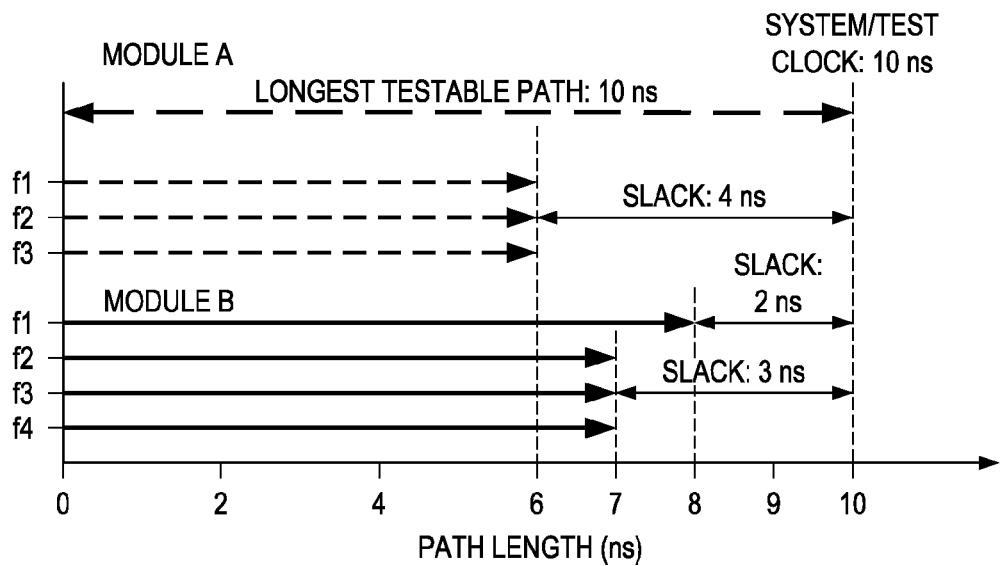
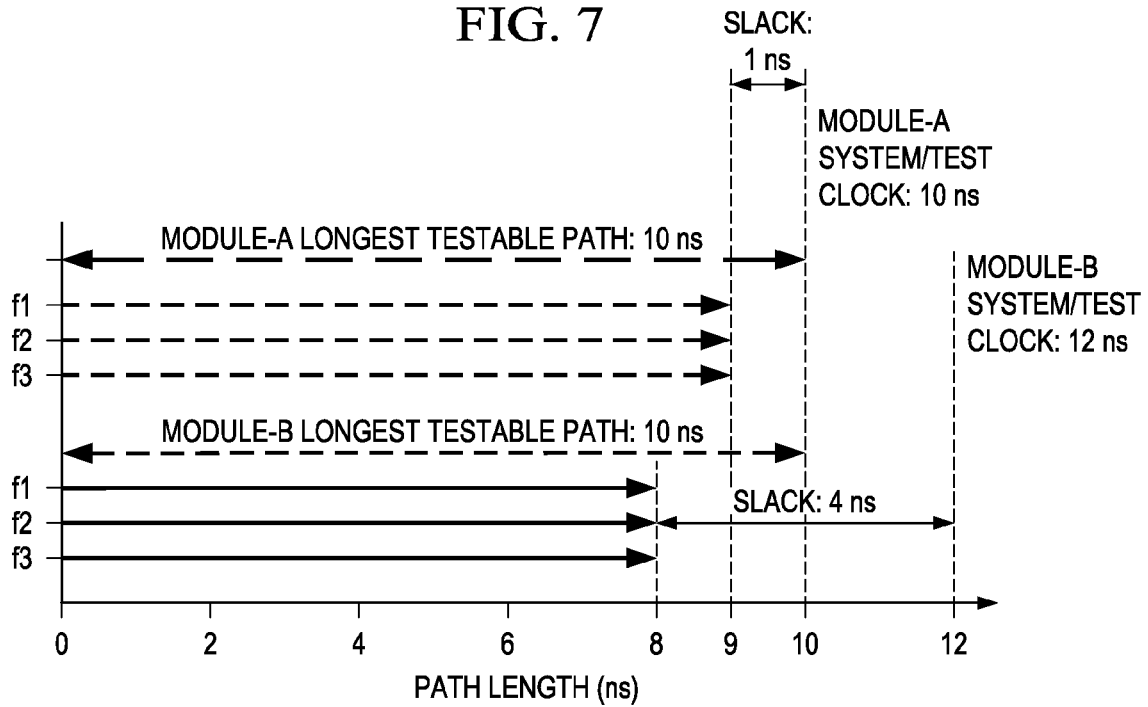

METHOD AND AN APPARATUS FOR EVALUATING SMALL DELAY DEFECT COVERAGE OF A TEST PATTERN SET ON AN IC

TECHNICAL FIELD

This application is directed, in general, to testing integrated circuits (ICs) and, more specifically, to evaluating the effectiveness of IC testing for small delay defects (SDD).

BACKGROUND

Automatic Test Pattern Generation (ATPG) is used to find a test pattern (an input or test sequence) that, when applied to an IC, allows a tester to determine between correct circuit behavior and faulty circuit behavior caused by defects. The generated test patterns can be used to test ICs after manufacture (i.e., manufacturing testing). The effectiveness of ATPG is often measured by the amount of modeled defects (i.e., fault models) that are detected and the number of generated patterns (i.e., pattern count).

Due to, for example, increased complexity and smaller feature sizes, testing chips (i.e., ICs) for manufacturing defects is becoming increasingly difficult. In addition to the increased transistor count, the use of new technology for the ICs can introduce new defect types which can lead to new types of defect tests. Along with the conventional stuck and transition fault models, accurate modeling and detection of timing related defects caused by process variation, power supply noise, crosstalk, design-for-manufacturing (DFM) related rule violations (such as single via nets) is critical to guarantee that manufactured silicon is defect free and does not posses a quality and reliability risk. As such, testing for fine delay defect or small delay defects (SDDs) is becoming a growing concern in the semiconductor industry. SDDs are defects that cause small delays relative to the timing margins allowed by the maximum operating frequency of an IC design.

Several EDA companies have launched commercial tools for supporting test pattern generation for screening SDD. To target SDDs, timing-aware ATPG tests have been developed. In timing-aware pattern generation, timing information is integrated, (e.g., from standard delay format (SDF) files) into the ATPG tool. The integrated timing information is used to guide the ATPG tool to detect faults through the longest paths of the IC in order to improve the ability to detect SDDs. Fault simulation uses the same timing information when grading the tests. Fault simulation, also referred to as fault grading, is performed to estimate fault coverage of the generated test patterns with respect to an IC. ATPG tools may measure and report the SDD coverage for a given set of test patterns according to metrics. Two such metrics are delay test coverage (DTC) and statistical delay quality level (SDQL).

SUMMARY

One aspect provides a method for evaluating SDDC of a set of test patterns on an IC. In one embodiment, the method is performed by a computer and includes: (1) selecting a transition fault of an integrated circuit detected by a test pattern set, the transition fault occurring at a fault site of the integrated circuit, (2) identifying path delays of a longest testable path and a longest tested path of the integrated circuit, wherein both the longest testable path and the longest tested path include the fault site, (3) determining a small delay defect detection probability for both the longest testable path and the longest tested path based on a probability that a small delay defect will be detected if present at the fault site and (4) calculating small delay defect coverage for the transition fault by dividing the small delay defect detection probability of the longest tested path by the small delay defect detection probability of the longest testable path.

In another embodiment, a test pattern evaluator is provided. In one embodiment, the test pattern evaluator is embodied as a plurality of instructions on a computer-readable storage medium that when the plurality of instructions are executed by a processor cause the processor to evaluate small delay defect coverage of a test pattern set, and the test pattern evaluator includes: (1) a delay determiner configured to identify path delays of a longest testable path and a longest tested path of an integrated circuit for each transition fault detected by a test pattern set, wherein the longest testable path and the longest tested path for the each transition fault include a fault site of the each transition fault and (2) a small delay defect coverage calculator configured to determine small delay defect coverage for the test pattern set by summing, for the each transition fault, a fault probability detection factor obtained by dividing a small delay defect detection probability of the longest tested path by a small delay defect detection probability of the longest testable path.

In yet another aspect, an apparatus for evaluating SDDC of a set of test patterns on an IC is disclosed. In one embodiment, the apparatus includes: (1) circuitry for selecting a transition fault of an integrated circuit detected by a test pattern set, the transition fault occurring at a fault site of the integrated circuit, (2) circuitry for identifying path delays of a longest testable path and a longest tested path of the integrated circuit, wherein both the longest testable path and the longest tested path include the fault site, (3) circuitry for determining a small delay defect detection probability for both the longest testable path and the longest tested path based on a probability that a small delay defect will be detected if present at the fault site and (4) circuitry for calculating small delay defect coverage for the transition fault by dividing the small delay defect detection probability of the longest tested path by the small delay defect detection probability of the longest testable path.

BRIEF DESCRIPTION

Reference is now made to the following descriptions taken in conjunction with the accompanying drawings, in which:

FIG. 4 illustrates a portion of an IC having a transition fault at a fault site and two paths through the fault site that are the longest testable path and the longest tested path;

FIG. 6 illustrates a graph representing the longest testable path and the longest tested paths of modules of an IC having multiple detected transition faults;

FIG. 7 illustrates another graph representing the longest testable path and the longest tested paths of modules of an IC having multiple detected transition faults.

DETAILED DESCRIPTION

The DTC metric and the SDQL metric may present problems when determining the SDD coverage of a test set. For example, the DTC metric does not take into account the effect of test timing on SDD coverage of a test set. DTC is also based on the underlying assumption that delay defects of all sizes have equal probability of occurrence. In general, however, delay defects of smaller sizes have higher probability than delay defects of larger sizes. Furthermore, when comparing two sets of test patterns, the test set with a higher value of DTC metric does not necessarily imply that it has higher coverage of small delay defects. Due to these shortcomings, the DTC metric may not be a good choice for evaluating and comparing the effectiveness of a set of test patterns for screening SDD.

Regarding SDQL, the SDQL metric is not normalized to the total number of faults in a circuit. Additionally, the SDQL metric represents the expected test escape level for a product due to delay defects instead of measuring the SDD coverage of a set of test patterns. As such, a fixed SDQL number cannot be used to specify the customer quality requirement, as the SDQL number might be totally unachievable for some designs depending on the size and system speed, even though the test set might have acceptable coverage for SDD.

Accordingly, this disclosure addresses evaluating the SDD coverage (i.e., small delay defect coverage (SDDC)) of a set of test patterns. The disclosure provides a method that allows the comparison of SDD coverage of test patterns to assist in determining the test patterns to use during SDD testing, even when the test patterns are generated using various methods. The disclosed method can also be used to order test patterns according to their SDD coverage so that when test patterns need to be truncated to fit on a particular tester, the best patterns can be selected. The disclosed method can also be used to specify customer quality requirements since the disclosed metric can accurately measure SDD coverage and is scalable with design parameters.

Figure 1:
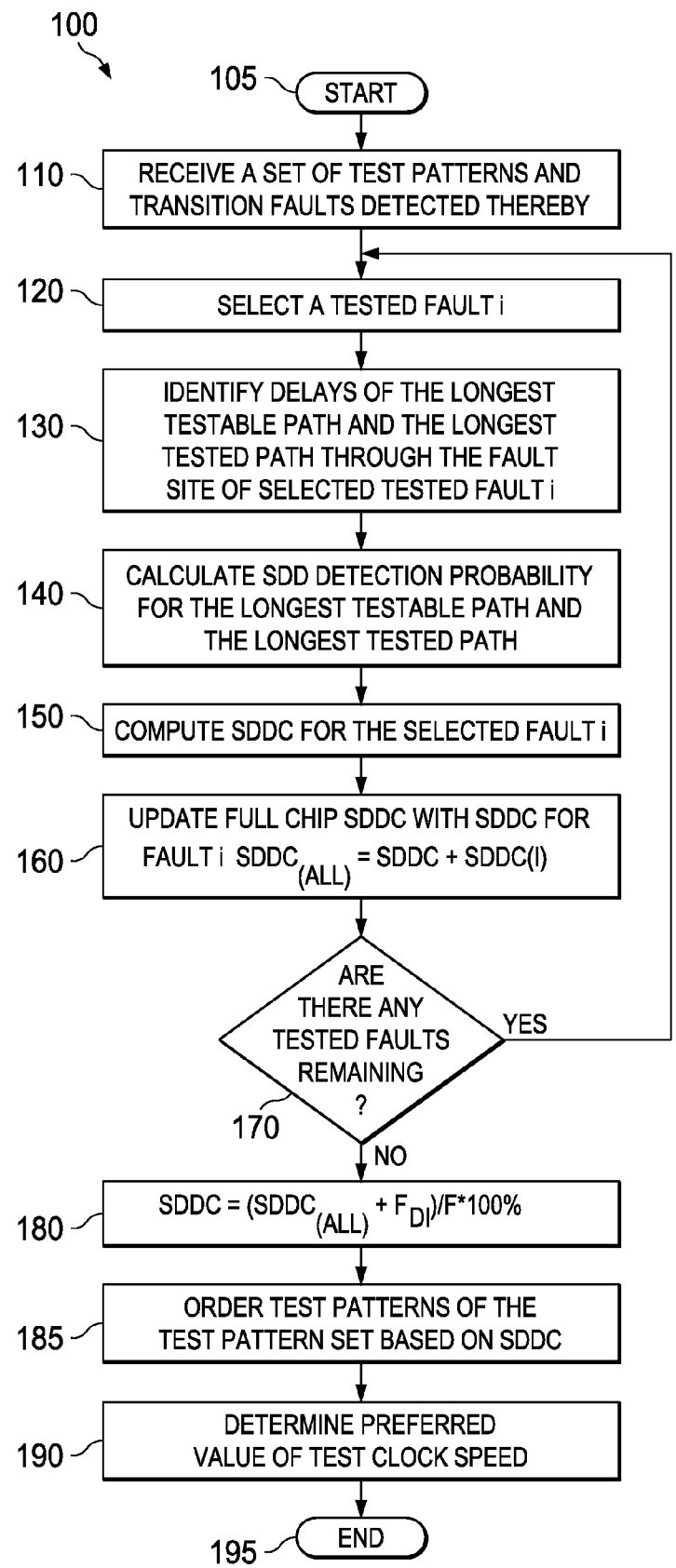
FIG. 1 illustrates a flow diagram of an embodiment of a method to evaluate SDD coverage for a test pattern set carried out according to the principles of the present disclosure.

FIG. 1 is a flow diagram of an embodiment of a method 100 performed by a computer to evaluate SDDC for a test pattern set carried out according to the principles of the present disclosure. The method 100 may be performed by a computer. In one embodiment a dedicated computing device may be designed to perform the method 100. The method 100 begins in a step 105.

In a step 110, a set of test patterns and a list of transition faults detected by the set of test patterns are received. The set of test patterns and the associated transition fault list may be obtained from an ATPG tool. The set of test patterns may include typical test patterns that are used to test for transition faults in ICs. In one embodiment, the set of test patterns includes multiple test patterns.

In a step 120, a fault tested by the test pattern set, (i.e., a detected transition fault, fault i) is selected. The order of selecting a tested fault may vary. In one embodiment, the first fault selected may be the first fault listed on the list of transition faults that is received.

After selecting a tested fault, the delay of the longest testable path through the fault site of the selected fault and the delay of the longest tested path through the fault site of the selected fault are identified in a step 130. To identify the delays associated with the longest testable path and the longest tested path, the method 100 may iterate through the list of all testable paths through the fault site of the selected fault.

Step 130 may be performed by commercial ATPG tools. In one embodiment, the ATPG may determine the longest testable path and the delay of the longest tested path by selecting a testable path for the fault i and calculating the test slack for the path if the path is the longest tested path. If the selected path is not the longest tested path, then the system slack for the selected path is calculated and the minimum system slack is updated accordingly. The iteration may continue until there are no remaining paths through the fault site for the fault i.

After identifying the delays of the longest testable path and the longest tested path through the fault site of the tested fault i, the method 100 continues to a step 140 that calculates, for both of the paths, the probability that a SDD will be detected if there is a defect present at the fault site. In one embodiment, the probability of detection for both of the paths is based on delay defect distribution data. The delay defect distribution data may be historical data based on previous testing. The historical data may be specific to an IC design.

In one embodiment where delay defect distribution data is available, determining the probability of detecting a SDD may be calculated according to Equation 1 below:

$$G(s) = \frac{\int_s^\infty H(s)\,ds}{\int_0^\infty H(s)\,ds}. \qquad \text{Equation 1}$$

Figure 2:
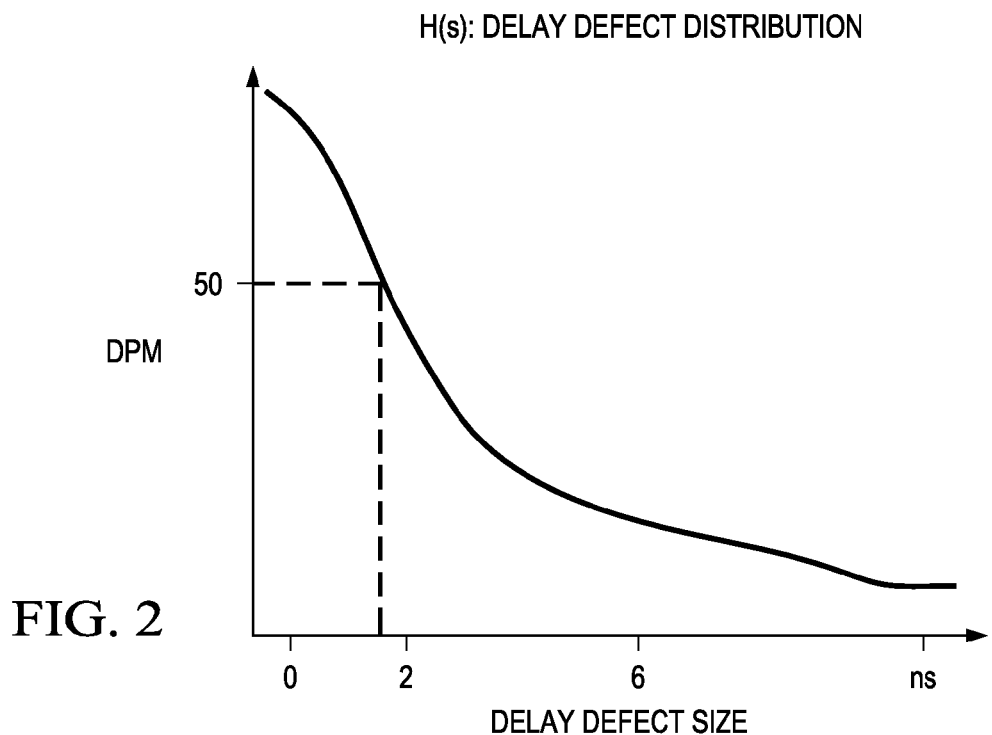
FIG. 2 illustrates a graph representing delay defect distribution data, H(s)
Figure 3:
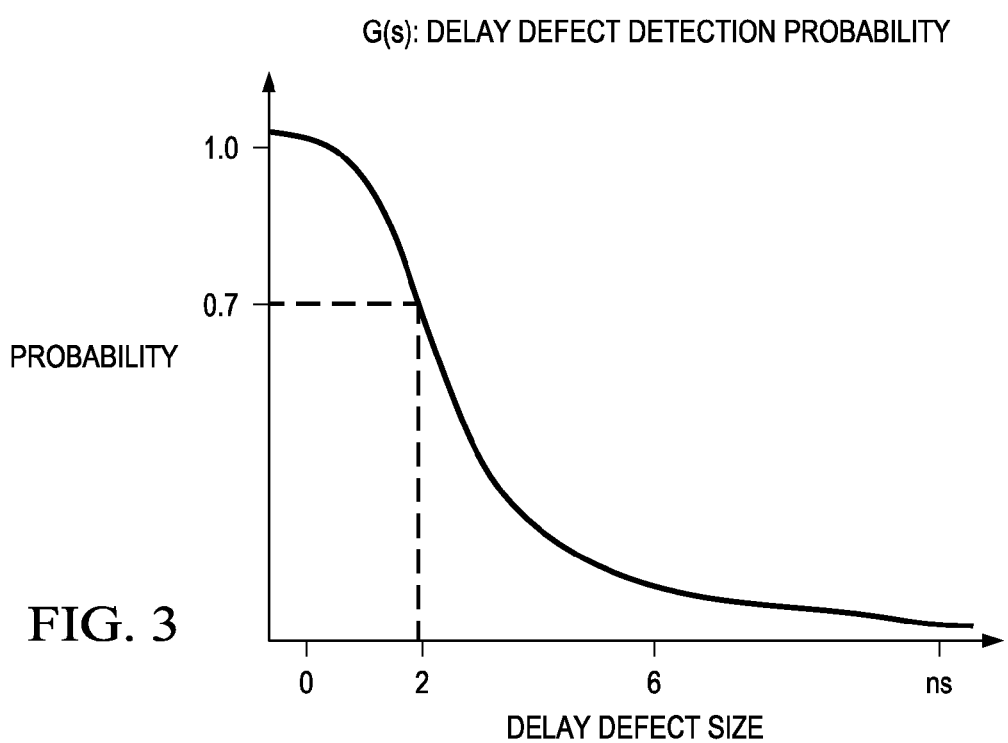
FIG. 3 illustrates a graph representing delay defect detection probability data G(s)

In Equation 1, G(s) is the delay defect detection probability of a delay defect of size s and H(s) is the probability of a delay defect of size s occurring. For example, the graph illustrated in FIG. 2 represents the delay defect distribution, H(s), having a y-axis that is the defective parts-per-million (DPM) and an x-axis that is the size of the delay defect in nanoseconds (ns). FIG. 3 illustrates the delay defect detection probability G(s) having a y-axis that is the probability and an x-axis that is the delay defect size. Employing FIG. 2, the probability of a delay defect the size of 2 nanoseconds equals 50 in one million or 0.00005. Employing FIG. 3, if a delay defect does occur, the probability that the delay is of a size of 2 nanoseconds or more is 0.7.

The delay defect detection probability G(s) may be computed as a pre-processing step employing Equation 1 and delay defect distribution data, such as from FIG. 2. For a delay defect size of zero (0), the delay defect detection probability G(s) would be one (G(0)=1). Additionally, if the delay defect has a negative value, the delay defect detection probability G(s) would be zero (G(negative values)=0).

When delay defect distribution data is not available, the probability that a SDD is detected in both paths may be assigned a value equal to the square of the path delay for both paths. For example, if the length of the longest tested path is four (4) nanoseconds, then the probability that a SDD is detected in the longest tested path is assigned a value of 4×4 or 16 nanoseconds. If the length of the longest testable path is seven (7) nanoseconds, then the probability that a SDD is detected in the longest testable path is assigned a value of 7×7 or 49 nanoseconds.

The small delay defect coverage (SDDC) for the selected fault is then computed in a step 150. In one embodiment where delay defect distribution is available, the SDDC for the selected fault may be calculated by dividing the SDD detection probability of the longest tested path through the fault under test clock conditions with the SDD detection probability of the longest testable path through the fault under system clock conditions. For example, Equation 2 below may be used to determine the SDDC for a single fault when delay defect distribution data is available.

$$SDDC = G(T_{TEST}\text{-tested path length})/G(T_{SYS}\text{-length of longest testable path}) \quad \text{Equation 2.}$$

In Equation 2, $T_{SYS}$ is the system clock period and $T_{TEST}$ is the test clock period. As such, Equation 2 may also be expressed as Equation 2A:

$$SDDC = G(\text{test slack})/G(\text{minimum slack}) \quad \text{Equation 2A.}$$

When delay defect distribution data is not available, then the SDDC for a single fault may be determined by dividing the assigned value for the probability of the longest tested path by the assigned value for the probability of the longest testable path. Equation 3 represents the SDDC for a fault when delay defect distribution data is not available.

$$SDDC = (P_i)^2/(P_{max\,i})^2 \quad \text{Equation 3.}$$

In Equation 3: $P_i$=(length of observation path (i.e., longest tested path) through fault i)+$(T_{sys}-T_{test})$; $T_{sys}$ is the system clock period; $T_{test}$ is the test clock period; and $P_{maxi}$ is the length of the longest testable path through fault i.

The SDDC for all of the selected tested faults is then computed by summing the SDDC for all of the individual selected faults in a step 160. The SDDC for all the selected faults may be calculated by adding the SDDC for the selected fault i with the existing value of the SDDC for all the selected faults according to Equation 4:

$$SDDC_{(ALL)} = SDDC_{(ALL)} + SDDC(i) \quad \text{Equation 4.}$$

A determination is then made in a first decisional step 170 if there are any tested faults that have not been selected. If there are no other tested faults that have not been selected, then the total SDDC coverage value for the test pattern set is determined in a step 180. In one embodiment, the total SDDC coverage value ($SDDC_{(TOTAL)}$) for the test set is determined by assigning SDDC coverage values of 1 for all shift testable faults ($F_{DI}$ in Equation 5 below), adding the SDDC values of all the detected faults and the shift testable faults and dividing by the total number of faults detected in the IC to place the total SDDC coverage value for the test set in a percentage. Equation 5 below represents the calculation where F represents the total number of faults detected by the test set.

$$SDDC_{(TOTAL)} = (SDDC_{(ALL)} + F_{DI})/F*100 \quad \text{Equation 5.}$$

With respect to the probability of detection, Equation 5 can be written in the form of Equation 5A.

$$SDDC^{True} = \left[\left(\sum_{i=1}^{F_{DS}} \frac{G(T_{test} - l^i_{ptested})}{G(T_{system} - l^i_{pmax})}\right) + F_{DI}\right] \times \left[\frac{1}{F}\right] \times 100. \quad \text{Equation 5A}$$

The variables of Equation 5A are defined below:
$l^i_{ptested}$: Length for tested path for fault i;
$l^i_{pmax}$: Length of longest testable path for fault i;
$T_{system}$: System clock period;
$T_{test}$: Test clock period;
G(s): Delay defect size probability for delay defect size s;
$F_{DS}$: Number of transition faults detected by test pattern set (e.g., ATPG patterns);
$F_{DI}$: Number of faults detected by implication (shift testable faults);
F: Total number of faults (i.e., $F_{DS}+F_{DI}$).
Without delay defect distribution data, $SDDC_{(TOTAL)}$ may be determined by the following Equation 5B:

$$SDDC = \left[\left(\sum_{i=1}^{F_{DS}} \frac{(P_i)^2}{(P_{max\,i})^2}\right) + F_{DI}\right] \times \left[\frac{1}{F}\right] \times 100. \quad \text{Equation 5B}$$

In other words, G(s) of the longest tested path and G(s) of the longest testable path in Equation 5A are replaced by $(P_i)^2$ and $(P_{max\,i})^2$ in Equation 5B.

After determining the $SDDC_{(TOTAL)}$, test patterns of the set of test patterns are placed in order according to their SDDC in a step 185. The method 100 can monitor and record the SDDC for each test pattern of the test pattern set while determining the $SDDC_{(TOTAL)}$. An ordered list of the test patterns according to SDDC may allow the truncation of certain test patterns in order to comply with a particular tester. The test patterns having the highest SDDC value can be selected and employed when testing a manufactured IC.

After determining the $SDDC_{(TOTAL)}$ for the test pattern set, the best, or preferred, value for the test clock speed may be determined in a step 190. The test clock speed can be varied in Equation 5A or 5B to be faster than the system clock speed to determine the preferred value of the test clock speed. The preferred clock speed value is the test clock speed that achieves the highest SDDC.

Figure 5A:
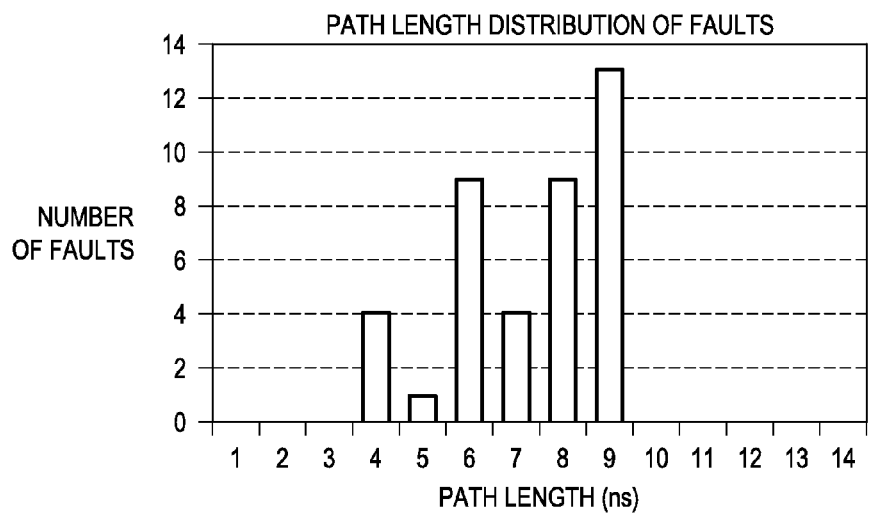
FIG. 5A illustrates a bar chart showing the distribution of the longest tested path length for all of the faults detected by a test pattern set.
Figure 5B:
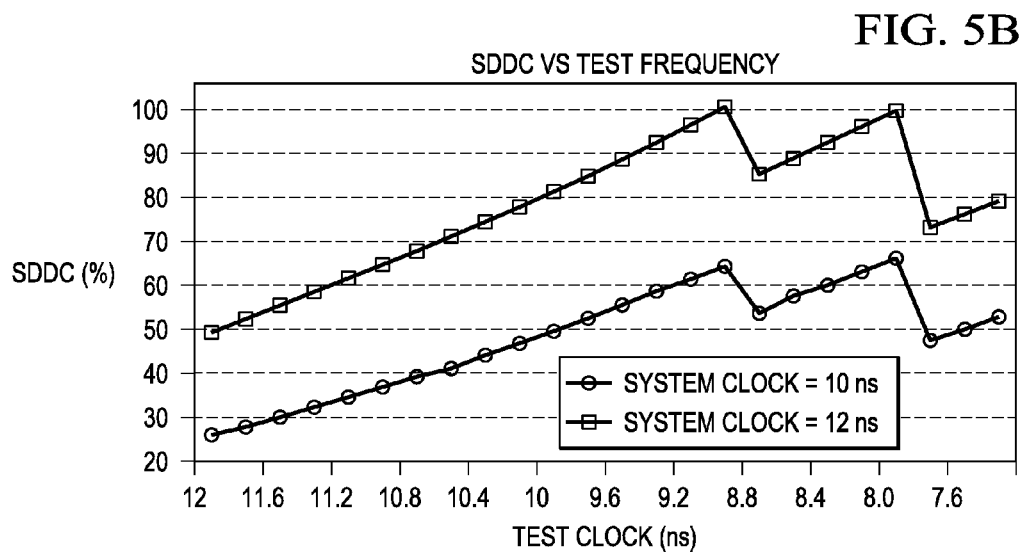
FIG. 5B illustrates a graph showing the SDDC of the test pattern set in FIG. 5A for different values of a test clock period.

An example of this analysis is illustrated in FIG. 5A and FIG. 5B for a small circuit consisting of 40 faults. FIG. 5A illustrates a bar chart showing the distribution of the longest tested path length for all of the faults detected by a test pattern set. FIG. 5B is a graph that illustrates the SDDC of the test pattern set for different values of a test clock period. Two cases are considered and illustrated. The first case is when the system clock is 12 ns and the second case is when the system clock is 10 ns. FIG. 5B illustrates that for both of the first and second cases, the highest coverage is achieved for a test clock period of 9 ns.

The method 100 then ends in a step 195. Returning now to the decisional step 170, if there are still remaining tested faults, the method continues to step 120. The method 100 then proceeds as described above.

Implementation of the method 100 is now shown through the following examples. In FIG. 4, the illustrated IC path has multiple logic elements. Additionally, multiple flip-flops, FF1, FF2, FF3, FF4 and FF5, are used along the IC path for applying and retrieving a test pattern. A transition delay fault detected by a test pattern at the fault site is also indicated in FIG. 4. Two paths, Path A and Path B are also indicated. Path A is the longest testable path passing through the fault site and Path B is the longest tested path passing through the fault site. As illustrated, the minimum slack between the longest path and the system clock is two nanoseconds (ns). Additionally, the test slack between the longest tested path and the test clock is six nanoseconds. The minimum slack (2 ns) and the test slack (6 ns) are also reflected in FIG. 4.

Returning now to FIG. 4 and Equation 2A, the SDDC for a single fault when delay defect distribution data is present may be calculated as follows:

$$SDDC = G(\text{test slack})/G(\text{minimum slack}) = G(6\text{ ns})/G(2\text{ ns}).$$

Additional examples for determining the SDDC at the chip-level or for an IC employing Equation 5A are presented below with respect to the graphs of FIGS. 6 and 7 that illustrate the longest testable path and longest tested paths of two ICs named module A and module B. In FIG. 6, the two ICs having same design margin are represented. In Module A, three faults, f1, f2, and f3, are illustrated. In Module B, four faults, f1, f2, f3 and f4, are illustrated. The SDDC for Module A is calculated to have a value of 20%. The SDDC for Module B is calculated to have a value of 34%.

The example shown in FIG. 6 compares two circuits with same speeds but different number of faults. Module-A has 3 faults and Module-B has 4 faults. For both circuits the system clock period and test clock period are 10 ns. Also the longest testable paths through all faults in both circuits are 10 ns long. The longest tested path through each of the faults is shown in FIG. 6. From FIG. 6, it can be seen that all the faults in Module-B are tested along longer paths than the faults in Module-A. Thus, the test for Module-B achieves a higher quality of small delay defect testing than the test for Module-A. This conclusion is also supported by the SDDC value computed using our proposed method which is 20% for Module-A and 34% for Module-B.

In FIG. 7, two modules, Module A and Module B of an IC are represented with both modules having the same number of faults, three, but having different design margins. Module A has three faults detected, f1, f2, f3, and has a system test clock of 10 nanoseconds. Module B also has three faults detected, f1, f2, f3, and has a system test clock of 12 nanoseconds. The SDDC for Module A is calculated to have a value of 69%. The SDDC for Module B is calculated to have a value of 43.5%.

Figure 8:
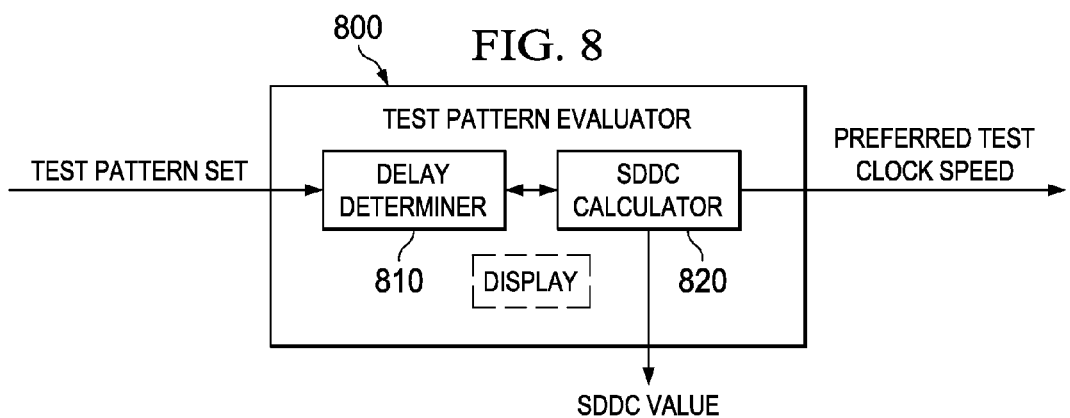
FIG. 8 is a block diagram of an embodiment of a test pattern evaluator constructed according to the principles of the present disclosure.

FIG. 8 is a block diagram of an embodiment of a test pattern evaluator 800 constructed according to the principles of the present disclosure. The test pattern evaluator 800 may be constructed with the necessary circuitry to perform each of the steps of the method 100. In one embodiment, the test pattern evaluator 800 may be embodied as a plurality of instructions on a computer-readable storage medium that, when executed by a processor, cause the processor to evaluate small delay defect coverage of a test pattern set. Additionally, the test pattern evaluator 800, or at least a portion thereof, may be part of an ATPG tool. In another embodiment, the test pattern evaluator 800 may be a dedicated device. The test pattern evaluator 200 includes a delay determiner 810 and a SDDC calculator 820.

The delay determiner 810 is configured to identify path delays of a longest testable path and a longest tested path of an IC for each transition fault detected by a test pattern set. The test pattern set includes multiple test patterns. The longest testable path and the longest tested path for each transition fault include a fault site of the transition faults. Thus, both the longest testable path and the longest tested path for each transition fault pass through the fault site of the transition fault.

The SDDC calculator 820 is configured to determine the SDDC for the test pattern set by summing, for each transition fault, a fault probability detection factor obtained by dividing a SDD detection probability of the longest tested path by a SDD detection probability of the longest testable path. In one embodiment, the SDDC calculator 820 is configured to determine the SDD detection probability for the longest testable path and the longest tested path based on a probability that a SDD will be detected if present at the fault site.

In another embodiment that does not have probability data, the SDDC calculator 820 is configured to assign a value for the SDD detection probability for both the longest testable path and the longest tested path based on the path delays of the longest testable path and the longest tested path. The assigned values may be equivalent to the square of the path lengths.

The SDDC calculator 820 is further configured to determine a SDDC value of the test pattern set by adding the SDDC values for transition faults and the SDDC values for the shift testable faults. The SDDC calculator 820 may assign SDDC values of one for shift testable faults of the IC detected by the test pattern set. In one embodiment, the SDDC calculator 820 is also configured to determine a preferred test clock speed for the test pattern set by varying a test clock speed. The test clock speed can be varied to a speed greater than a speed of the system clock of the IC. The SDDC calculator 820 may be configured to generate electrical signals to provide the SDDC values and the preferred test clock speed. The electrical signals may be used to provide a visual display, an audible announcement, a print-out or transmit the SDDC values and the preferred test clock speed to another device. The test pattern evaluator 800 may include a display to provide an output.

The SDDC metric disclosed herein considers the length/slack of observation paths for detected faults. Additionally, the SDDC metric considers the effects of loose as well as faster than at-speed test timing. Delay defect distribution data is incorporated into the SDDC value if the data is available.

The disclosed SDDC metric provides a percentage value between 0 to 100% that should be easy to interpret and scalable with chip size/number of faults. If all timing non-redundant faults are observed along their longest testable paths, the metric should evaluate to 100%. An SDDC value greater than 100% may indicate detection of timing redundant delay defects (reliability screening).

The above-described apparatus and methods may be embodied in or performed by various conventional digital data processors or computers, wherein the computers are programmed or store executable programs of sequences of software instructions to perform one or more of the steps of the methods, e.g., steps of the method of FIG. 1. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 1. Additionally, an apparatus, such as a test pattern evaluator, may be designed to include the necessary circuitry to perform each step of the method of FIG. 1.

Those skilled in the art to which this application relates will appreciate that other and further additions, deletions, substitutions and modifications may be made to the described embodiments.

What is claimed is:

1. A method performed by a processor for evaluating small delay defect coverage of a set of test patterns on an integrated circuit, comprising the following steps:
   (a) selecting a transition fault of an integrated circuit detected by a test pattern set, said transition fault occurring at a fault site of said integrated circuit;
   (b) identifying path delays of a longest testable path and a longest tested path of said integrated circuit, wherein both said longest testable path and said longest tested path include said fault site;
   (c) determining a small delay defect detection probability for both said longest testable path and said longest tested path, wherein said small delay defect detection probability for said longest testable path is a probability that if a delay defect occurs, said delay defect at said fault site is equal to or greater than a difference between a system clock period and a path delay of said longest testable path and said small delay detection probability for said longest tested path is a probability that if a delay defect occurs, said delay defect at said fault site is equal to or greater than a difference between a test clock period and a path delay of said longest tested path; and (d) calculating small delay defect coverage for said transition fault by dividing said small delay defect detection probability of said longest tested path by said small delay defect detection probability of said longest testable path;

wherein step (c) is performed by said processor.

2. The method as recited in claim 1 further comprising determining said small delay defect detection probability for both said longest testable path and said longest tested path according to delay defect distribution data.

3. The method as recited in claim 2 further comprising assigning a value, when said delay defect distribution data is unavailable, for said small delay defect detection probability for both said longest testable path and said longest tested path based on said path delays of said longest testable path and longest tested path.

4. The method as recited in claim 1 further comprising repeating steps (a), (b), (c) and (d) for additional transition faults detected by said test pattern set.

5. The method as recited in claim 4 further comprising summing said small delay defect coverage for said transition fault with additional small delay defect coverages calculated for said additional transition faults to obtain a small delay detect coverage for all transition faults detected by said test pattern set.

6. The method as recited in claim 5 further comprising assigning small delay defect coverage values of one for shift testable faults of said integrated circuit detected by said test pattern set.

7. The method as recited in claim 6 further comprising determining a total small delay detect coverage value of said test pattern set by adding said small delay detect coverage for said all transition faults and said small delay defect coverage values for said shift testable faults.

8. The method as recited in claim 1 wherein said test pattern set includes multiple test patterns.

9. The method as recited in claim 1 further comprising determining a preferred test clock speed for said test pattern set by varying a test clock period.

10. A test pattern evaluator embodied as a plurality of instructions on a non-transitory computer-readable storage medium that when said plurality of instructions are executed by a processor cause said processor to evaluate small delay defect coverage of a test pattern set, said test pattern evaluator comprising:

a delay determiner configured to identify path delays of a longest testable path and a longest tested path of an integrated circuit for each transition fault detected by a test pattern set, wherein said longest testable path and said longest tested path for said each transition fault include a fault site of said each transition fault; and a small delay defect coverage calculator configured to determine small delay defect coverage for said test pattern set by summing, for said each transition fault, a fault probability detection factor obtained by dividing a small delay defect detection probability of said longest tested path by a small delay defect detection probability of said longest testable path, wherein said small delay defect detection probability for said longest testable path is a probability that if a delay defect occurs, said delay defect at said fault site is equal to or greater than a difference between a system clock period and a path delay of said longest testable path and said small delay detection probability for said longest tested path is a probability that if a delay defect occurs, said delay defect at said fault site is equal to or greater than a difference between a test clock period and a path delay of said longest tested path.

11. The test pattern evaluator as recited in claim 10 wherein said small delay defect coverage calculator is further configured to determine said small delay defect detection probability for said longest testable path and said longest tested path based on a probability that a small delay defect will be detected if present at said fault site.

12. The test pattern evaluator as recited in claim 11 wherein said small delay defect coverage calculator is configured to determine said small delay defect detection probability for both said longest testable path and said longest tested path according to delay defect distribution data.

13. The test pattern evaluator as recited in claim 12 wherein said small delay defect coverage calculator is configured to assign a value, when said delay defect distribution data is unavailable, for said small delay defect detection probability for both said longest testable path and said longest tested path based on said path delays of said longest testable path and said longest tested path.

14. The test pattern evaluator as recited in claim 10 wherein said small delay defect coverage calculator is further configured to assign small delay defect coverage values of one for shift testable faults of said integrated circuit detected by said test pattern set.

15. The test pattern evaluator as recited in claim 14 wherein said small delay defect coverage calculator is further configured to determine small delay defect coverage value of said test pattern set by adding said small delay detect coverage and said small delay defect coverage values for said shift testable faults.

16. The test pattern evaluator as recited in claim 10 wherein said test pattern set includes multiple test patterns.

17. The test pattern evaluator as recited in claim 10 wherein said small delay defect coverage calculator is further configured to determine a preferred test clock speed for said test pattern set by varying a test clock period.

18. An apparatus for evaluating small delay defect coverage of a set of test patterns on an integrated circuit, comprising:

circuitry for selecting a transition fault of an integrated circuit detected by a test pattern set, said transition fault occurring at a fault site of said integrated circuit;

circuitry for identifying path delays of a longest testable path and a longest tested path of said integrated circuit, wherein both said longest testable path and said longest tested path include said fault site;

circuitry for determining a small delay defect detection probability for both said longest testable path and said longest tested path, wherein said small delay defect detection probability for said longest testable path is a probability that if a delay defect occurs said delay defect at said fault site is equal to or greater than a difference between a system clock period and a path delay of said longest testable path and said small delay detection probability for said longest tested path is a probability that if a delay defect occurs, said delay defect at said fault site is equal to or greater than a difference between a test clock period and a path delay of said longest tested path; and circuitry for calculating small delay defect coverage for said transition fault by dividing said small delay defect detection probability of said longest tested path under test clock conditions by said small delay defect detection probability of said longest testable path under system clock conditions.

19. The apparatus as recited in claim 18 further comprising circuitry for determining a total small delay detect coverage value for said test pattern set as a percentage value based on all faults detected by said test pattern set, a sum of small delay detect coverage values for all transition faults detected by said test pattern set and a small delay defect coverage value representing shift testable faults detected by said test pattern set.

20. The apparatus as recited in claim 18 further comprising circuitry for determining a preferred test clock speed for said test pattern set by varying a test clock period to be greater than a system clock speed of said integrated circuit.

* * * * *